US012713843B2

(12) United States Patent
Watanabe et al.

(10) Patent No.: US 12,713,843 B2
(45) Date of Patent: Aug. 18, 2026

(54) NITRIDE LAMINATE AND MANUFACTURING METHOD OF THE SAME

(71) Applicant: Nitto Denko Corporation, Ibaraki (JP)

(72) Inventors: Masahiko Watanabe, Ibaraki (JP); Toshitaka Nakamura, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 93 days.

(21) Appl. No.: 17/911,616

(22) PCT Filed: Mar. 2, 2021

(86) PCT No.: PCT/JP2021/007800
§ 371 (c)(1),
(2) Date: Sep. 14, 2022

(87) PCT Pub. No.: WO2021/187077
PCT Pub. Date: Sep. 23, 2021

(65) Prior Publication Data

US 2023/0121803 A1 Apr. 20, 2023

(30) Foreign Application Priority Data

Mar. 19, 2020 (JP) ................................ 2020-049416
Feb. 12, 2021 (JP) ................................ 2021-020426

(51) Int. Cl.
*H10P 14/20* (2026.01)
*C23C 14/02* (2006.01)
(Continued)

(52) U.S. Cl.
CPC .......... *H10P 14/2922* (2026.01); *C23C 14/02* (2013.01); *C23C 14/0617* (2013.01);
(Continued)

(58) Field of Classification Search
None
See application file for complete search history.

(56) References Cited

U.S. PATENT DOCUMENTS

2007/0284991 A1* 12/2007 Egi .................. G02F 1/133502 313/479
2009/0246385 A1* 10/2009 Felmetsger .......... C23C 14/024 204/192.18

(Continued)

FOREIGN PATENT DOCUMENTS

CN 101918624 A 12/2010
CN 106165025 A 11/2016

(Continued)

OTHER PUBLICATIONS

International Search Report dated Apr. 27, 2021 for corresponding International Patent Application No. PCT/JP2021/007800.

(Continued)

*Primary Examiner* — Seth Dumbris
(74) *Attorney, Agent, or Firm* — HAUPTMAN HAM, LLP

(57) ABSTRACT

A nitride laminate, in which contamination in the nitride layer is suppressed and crystallinity is improved, is provided. A nitride laminate includes a polymer substrate, and a nitride layer provided on at least one of the surfaces of the polymer substrate. The nitride layer has a wurtzite crystal structure. The atomic proportion of oxygen in the nitride layer is 2.5 atm. % or less, and the atomic proportion of hydrogen in the nitride layer is 2.0 atm. % or less. The FWHM of the X-ray rocking curve of the nitride layer is 8 degree or less.

8 Claims, 5 Drawing Sheets

(51) Int. Cl.
*C23C 14/06* (2006.01)
*C23C 14/35* (2006.01)
*H10P 14/22* (2026.01)

(52) U.S. Cl.
CPC .............. *C23C 14/35* (2013.01); *H10P 14/22* (2026.01); *H10P 14/3241* (2026.01); *H10P 14/3416* (2026.01)

(56) References Cited

U.S. PATENT DOCUMENTS

| | | | | |
|---|---|---|---|---|
| 2011/0018104 | A1 | 1/2011 | Nagashima et al. | |
| 2014/0234616 | A1 | 8/2014 | Hultman et al. | |
| 2017/0096365 | A1 | 4/2017 | Henn et al. | |
| 2020/0274052 | A1* | 8/2020 | Kimura | H10N 30/878 |
| 2020/0381610 | A1* | 12/2020 | Arimoto | H10N 30/076 |

FOREIGN PATENT DOCUMENTS

| | | | | |
|---|---|---|---|---|
| CN | 107151780 | A | 9/2017 | |
| CN | 110462860 | A | 11/2019 | |
| JP | H03-104308 | A | 5/1991 | |
| JP | H07-316809 | A | 12/1995 | |
| JP | 2008-211095 | A | 9/2008 | |
| JP | 2016-141861 | A | 8/2016 | |
| JP | 2017-75090 | A | 4/2017 | |
| WO | WO-2018180340 | A1 * | 10/2018 | H01L 41/0478 |
| WO | WO-2019059051 | A1 * | 3/2019 | C23C 14/06 |

OTHER PUBLICATIONS

Written Opinion dated Apr. 27, 2021 for corresponding International Patent Application No. PCT/JP2021/007800.

K. Ait Aissa et al., "Comparison of the structural properties and residual stress of AlN films deposited by dc magnetron sputtering and high power impulse magnetron sputtering at different working pressures," Thin Solid Firms, 2014, pp. 264-267, vol. 530.

K Ait Aissa et al., "AlN films deposited by dc magnetron sputtering and high power impulse magnetron sputtering for SAW application", Journal of Physics D applied Physics, Mar. 2015, 48(14):145307, 8 pages, cited in the Specification.

Office Action issued on Jul. 7, 2024 for corresponding Chinese Patent Application No. 202180020973.X, along with an English translation (12 pages).

Office Action issued on Nov. 19, 2024 for corresponding Japanese Patent Application No. 2021-020426, along with an English translation (6 pages).

Japanese Office Action issued on Jun. 3, 2025, for corresponding Japanese Patent Application No. 2021-020426 along with an English translation (6 pages).

Office Action issued on Mar. 27, 2024 for corresponding Chinese Patent Application No. 202180020973.X, along with partial English machine translation (15 pages).

Office Action issued on Dec. 25, 2024 for corresponding Chinese Patent Application No. 202180020973.X, along with an English translation (13 pages).

* cited by examiner

| Example/ Comparative example | STRUCTURE | | | | | ORIENTATION (XRC FWHM) (°) | COMPOSITION (atomic%) | | | | | |
|---|---|---|---|---|---|---|---|---|---|---|---|---|
| | power source | nitride layer | thickness of nitride layer | degassing | metallic underlayer | | Al | Ga | N | H | O | Ar |
| Example 1 | HiPIMS | AlN | 0.5 μm | with | w/o | 6.5 | 50.8 | — | 48.8 | 0.4 | — | 0.0 (0.01) |
| Example 2 | HiPIMS | AlN | 0.5 μm | with | Mo 100nm | 7.0 | 49.5 | — | 50.2 | 0.3 | — | 0.0 (0.01) |
| Example 3 | HiPIMS | AlN | 0.5 μm | with | Ti 100nm | 4.0 | 49.1 | — | 50.6 | 0.3 | — | 0.0 (0.02) |
| Example 4 | HiPIMS | AlN | 1 μm | with | w/o | 6.0 | 50.1 | — | 49.5 | 0.4 | — | 0.0 (0.01) |
| Example 5 | HiPIMS | GaN | 0.5 μm | with | w/o | 7.6 | — | 49.9 | 49.6 | 0.5 | — | 0.0 |
| Comparative example 1 | HiPIMS | AlN | 0.5 μm | w/o | w/o | 29.0 | 48.5 | — | 49.3 | 2.2 | — | 0.0 (0.01) |
| Comparative example 2 | RF | AlN | 0.5 μm | with | w/o | 24.4 | 50.2 | — | 49.1 | 0.6 | — | 0.1 |
| Comparative example 3 | DCMS | AlN | 0.5 μm | with | w/o | 27.8 | 47.4 | — | 45.5 | 4.2 | 2.9 | 0.0 (0.02) |
| Comparative example 4 | DCMS | GaN | 0.5 μm | with | w/o | 29.8 | — | 47.7 | 47.6 | 3.2 | 1.5 | 0.0 |

NITRIDE LAMINATE AND MANUFACTURING METHOD OF THE SAME

CROSS-REFERENCE TO RELATED APPLICATION

This application is a National Stage of International Application No. PCT/JP2021/007800, filed on Mar. 2, 2021, which designates the United States and was published in Japan, and which is based upon and claims priority to Japanese Patent Application No. 2020-049416 filed on Mar. 19, 2020 and Japanese Patent Application No. 2021-020426 filed on Feb. 12, 2021, in the Japan Patent Office. All of the aforementioned applications are hereby incorporated by reference in their entireties.

TECHNICAL FIELD

The present invention relates to a nitride laminate, and a manufacturing method of the same.

BACKGROUND ART

Electrically insulating nitrides such as aluminum nitride (AlN) are used various devices including high-frequency noise filters, piezoelectric devices, and ultrasonic devices. Semiconductor nitrides such as gallium nitride (GaN) are also widely used in semiconductor optical devices such as light emitting diodes (LEDs) or lasers.

A nitride thin film can be formed by a reactive sputtering method, which has a higher material utilization of than chemical vapor deposition (CVD), while the film deposition temperature is lower than CVD. Inert gas ions are accelerated and collide with a metal target such as aluminum target or a metallic gallium target at a high speed. The metal ions ejected from the target react with nitrogen gas, and the molecules of the reaction product are deposited as a material of a thin film onto the surface of a substrate which is held so as to face the metal target. A power source is connected between the metal target and the substrate. The power source may be either a direct current (DC) power source or a radio frequency (RF) power source. With either type of the power source, a magnetron is provided in the target electrode to accelerate the charged particles, thereby promoting the ionization of the inert gas and improving the film deposition rate.

A technique of fabricating an AlN layer on a silicon (Si) wafer by high power RE sputtering is known (see, for example, Patent Document 1 presented below). A technique of fabricating a Wurtzite crystal piezoelectric layer on a polymer thin film by RF magnetron sputtering is also known. (see, for example, Patent Document 2 presented below).

AlN thin films can be formed on Si substrates by DC magnetron sputtering. A method of removing the moisture having attached onto the inner wall of a chamber prior to DC magnetron sputtering is proposed (see, for example, Patent Document 3 presented below). With this method, the sputtering chamber is heated and evacuated, while a Si wafer is placed on the wafer holder in the chamber, and then the wafer is maintained in the chamber for about 2 hours prior to the DC magnetron sputtering.

It has been reported that high power impulse magnetron sputtering (HiPIMS) can reduce the half width at full width of the X-ray rocking curve of the AlN film formed on a Si substrate (for example, Non-Patent Document 1 presented below).

SUMMARY OF THE INVENTION

Technical Problem to be Solved

In fabrication of a nitride thin film on a polymer substrate, the film deposition temperature is restricted, compared with deposition of the nitride thin film onto an inorganic substrate such as a Si wafer. In addition, water cannot be completely removed from the chamber, even if heating and evacuation are performed according to the method described in Patent Document 3, and hydrogen (H) atoms and oxygen (O) atoms derived from the water during the sputtering process may be captured into the film occasionally. With high power RF sputtering, argon (Ar) atoms of the inert gas are captured into the film.

One of the objectives of the present invention is to provide a nitride laminate having an improved crystallinity with less contamination in a nitride layer.

Technical Solution(s)

The inventors have repeated experiments based on the presumption that oxygen atoms, hydrogen atoms, or some other atoms captured into a nitride behave as contaminants, and affect the crystallinity and the orientation of the nitride thin film. The inventors have successfully produced a nitride laminate having a good crystal quality, by suppressing water-induced contamination in a nitride layer formed on a polymer substrate.

In one aspect of the disclosure, a nitride laminate includes a polymer substrate, and a nitride layer provided on at least one of the surfaces of the polymer substrate. The nitride layer has a wurtzite crystal structure. The atomic proportion of oxygen in the nitride layer is 2.5 atm. % or less, and the atomic proportion of hydrogen in the nitride layer is 2.0 atm. % or less. The full width at half maximum (FWHM) of the X-ray rocking curve of the nitride layer is 8 degrees or less.

Advantageous Effect of the Invention

With the above-described configuration, a nitride laminate having an improved crystallinity with less contamination is achieved.

BRIEF DESCRIPTION OF DRAWINGS

FIG. 4 shows analysis results of nitride layers formed on a glass substrate and a polymer substrate by different processes.

EMBODIMENTS FOR IMPLEMENTING THE INVENTION

Figures 1A, 1B:
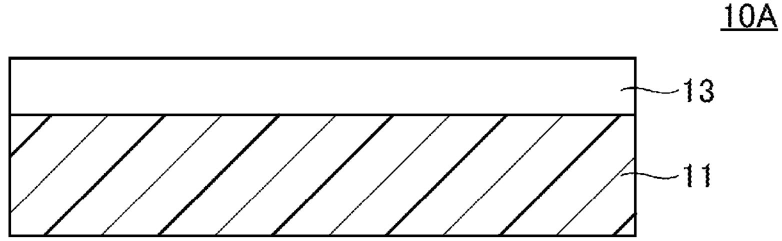
FIG. 1A is a schematic diagram of a nitride laminate according to an embodiment.
FIG. 1B is a schematic diagram of a nitride laminate according to another embodiment.

In the embodiments, nitrogen atoms in the reactive gas phase are activated by high power impulse magnetron sputtering (hereinafter referred to as "HiPIMS") to suppress contamination due to a water component remaining in the chamber which has not been completely removed. This technique improves the crystal orientation of the nitride layer formed on polymer substrate.

FIG. 1A to FIG. 1D are schematic diagrams nitride laminates according to the embodiments. A nitride laminate 10A shown in FIG. 1A has a polymer substrate 11, and a nitride layer 13 formed on at least one of the main surfaces of the polymer substrate 11. The nitride layer 13 has a wurtzite crystal structure, and is formed by a HiPIMS process.

In the HiPIMS process, a large power of several tens of kilowatts to megawatts is instantaneously input, while the power is OFF in 99% or more of the process along the time axis. By instantaneously turning on such a high electric power, plasma is generated at a higher density than ordinary magnetron sputtering, and ionization rates of the particles of the source material and the reactive gas are promoted. The source material ions and the reactive gas ions sufficiently spread around and adhere to the surface of the polymer substrate 11, and the chemical bonding condition of the nitride is improved. As a result, a smooth and dense film having good crystallinity is formed on the main surface of the polymer substrate 11 at a lower temperature.

The atomic proportion of oxygen contained in the nitride layer 13 is 2.5 atm. % or less, and the atomic proportion of hydrogen contained in the nitride layer 13 is 2.0 atm. % or less. The grounds for these values will be described later.

The nitride layer 13 is formed of AlN, GaN, indium nitride (InN), or a compound thereof. These materials have a wurtzite crystal structure, and are polarized in the c-axis direction. Wurtzite crystals are stable in the atmosphere. The band gap of InN is as narrow as about 0.1 eV, but the band gap of AlN is as wide as 6.2 eV. The bandgap of GaN is 3.4 eV. Therefore, light emitting devices over a wide wavelength range from near infrared to ultraviolet can be manufactured using the nitride layer 13. The nitride layer 13 is also applicable to piezoelectric devices making use of the dielectric polarization in the c-axis direction.

The FWHM of the X-ray rocking curve observed from the (002) plane of the nitride layer 13 is preferably 8 degrees or less, more preferably 7 degrees or less. The grounds for these values will also be described later.

The material of the polymer substrate 11 is selected from polyethylene terephthalate (PET), polyethylene naphthalate (PEN), polycarbonate (PC), acrylic resin, cycloolefin polymer, polyimide (PI), or the like. By using the polymer substrate 11, the nitride laminate can be applied to a flexible light emitting device, a piezoelectric device, a frequency filter, and a roll-to-roll process.

Among the above-described materials, PET, PEN, PC, acrylic resin, and cycloolefin polymer are colorless and transparent materials, and are advantageous when the nitride laminate 10A is applied to light-transparent devices such as light emitting devices. If the nitride laminate 10A is used in applications that do not require transparency, such as healthcare products including pulse rate monitors and heart rate monitors, or in-vehicle pressure sensing sheets, then translucent or opaque plastic materials such as PI may be used.

A desired thickness of the nitride layer 13 can be acquired by controlling the conditions of the film deposition. The thickness may be 10 nm or more, and 10 μm or less, depending on the application. If the nitride layer 13 is used as an orientation control layer for improving the crystal orientation of an upper layer, the thickness may be 10 nm to 50 nm. When the nitride layer 13 is used as a piezoelectric layer or a sensing layer, the thickness may be 200 nm to 1 μm or more. An electrode layer may be provided on at least one surface of the nitride layer 13.

The desired film thickness can be achieved by controlling the film deposition time, pulse width, pulse frequency, source gas flow rate, bias voltage, or other parameters of the HiPIMS. Since the nitride layer is formed on the polymer substrate 11, it is desirable to form the nitride layer at a substrate temperature of 150° C. or lower, more preferably 100° C. or lower. The pulse width is 1 μs to 300 μs. With a pulse width exceeding 300 μs, the influence of heat on the polymer substrate material 11 becomes conspicuous. With a pulse width less than 1 μs, ionization of the source material particles and the reactive gas will be difficult.

FIG. 1B is a schematic diagram of a nitride laminate 10B. The nitride laminate 10B has a metal layer 12 between the polymer substrate 11 and the nitride layer 13. The metal layer 12 serves as at least one of an electrode layer for applying a voltage to the nitride layer 13 or an underlayer for improving the crystal quality of the nitride layer 13.

The metal layer 12 may be formed of a metal having a body-centered cubic structure, such as molybdenum (Mo), tungsten (W), lithium (Li), tantalum (Ta), niobium (Nb), or a layered structure of these metals. For the metal layer 12, a metal having a hexagonal close-packed structure, such as titanium (Ti), hafnium (Hf), ruthenium (Ru), zirconium (Zr), cobalt (Co), or a layered structure of these metals, may be used.

By providing a layer of these metals under the nitride layer 13, the crystal orientation of the nitride layer 13 is improved, as will be described later. With the metal layer 12 used as the underlayer of the nitride layer 13, the thickness of the metal layer 12 is 10 nm to 200 nm, more preferably 30 nm to 150 nm. With the metal layer 12 used as an electrode, the thickness is 50 nm to 400 nm, more preferably 100 nm to 300 nm, from the viewpoint of downsizing of the device and the stability of the electrical characteristics.

The metal layer 12 can be formed by sputtering at room temperature or under slight heating at 100° C. or lower.

Figure 1C:
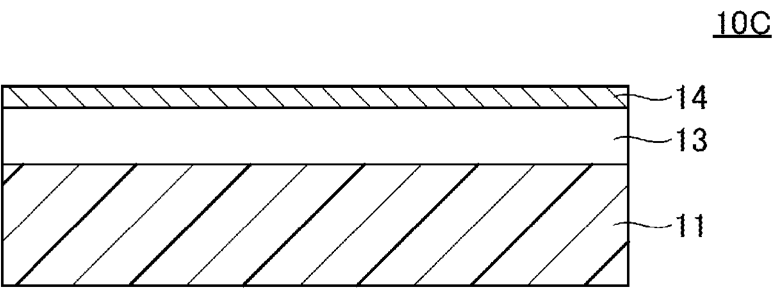
FIG. 1C is a schematic diagram of a nitride laminate according to yet another embodiment.

FIG. 1C is a schematic diagram of a nitride laminate 10C. The nitride laminate 10B has a metal layer 14 on the top surface of a nitride layer 13 formed on a polymer substrate 11. The metal layer 14 may be formed of the same metals as those used in the nitride laminate 10B of FIG. 1B.

By forming an electrode layer on the back surface of the polymer substrate 11, the nitride laminate 10C itself can be used as a device. Alternatively, the second nitride layer and the second metal layer may be stacked on the metal layer 12 so as to be used as a device.

Figure 1D:
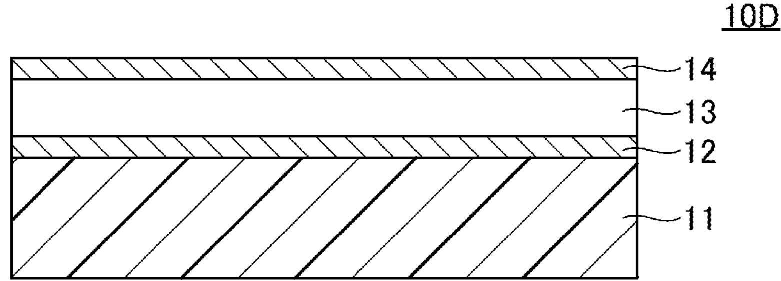
FIG. 1D is a schematic diagram of a nitride laminate according to still another embodiment.

FIG. 1D is a schematic diagram of a nitride laminate 10D. The nitride laminate 10D has a metal layer 12 and a metal layer 14 provided on both surfaces of the nitride layer 13. The nitride laminate 10D has a sandwich structure of the metal layer 12, the nitride layer 13, and the metal layer 14, which can be applied to a piezoelectric device, a high-frequency filter, a sensor, or the like. The nitride laminate 10D uses a thin and flexible polymer substrate 11, and accordingly, electric charges can be produced by dielectric polarization even under a weak force when the nitride laminate is applied to a piezoelectric device.

Figure 2:
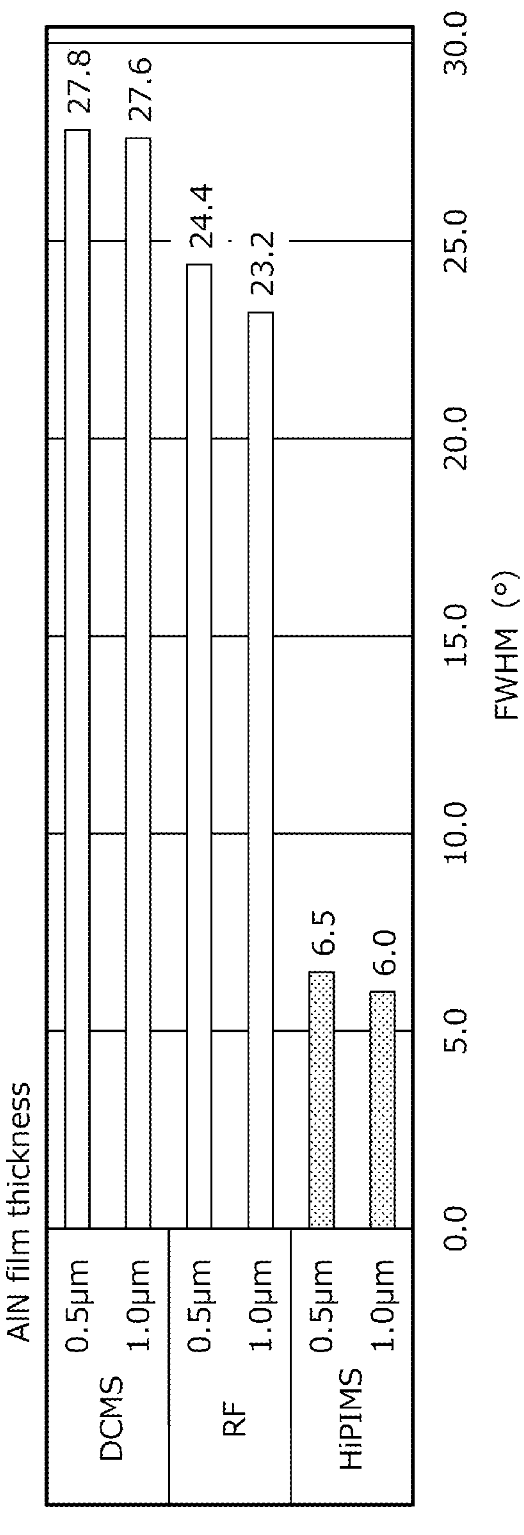
FIG. 2 shows FWHM values of the X-ray rocking curves from the (002) planes of nitride layers formed on a polymer substrate by different processes.

FIG. 2 shows FWHM values of the X-ray rocking curve from the (002) plane of the AlN layer formed on the polymer substrate 11 by different methods. A polyimide (PI) film having a thickness of 50 μm is used as the polymer substrate 11.

The FWHM of an X-ray rocking curve is used as an index of crystal orientation. The smaller the FWHM, the more uniform the crystal orientation. The integral (or the area size of the peak) of the rocking curve represents crystallinity. The greater the peak area, the greater the crystal size.

In addition to HiPIMS used in the embodiment, DC magnetron sputtering (DCMS) and RF sputtering are used as comparative examples of the sputtering process to form, the AlN layer. In the respective sputtering processes, the power is set to 500 W, the pressure is set to 0.67 Pa, the distance between the target and the substrate is set to 65 mm, the nitrogen (112) gas sharing ratio is set to 17%, and the back pressure is set to $3\times10^{-5}$ Pa. For all the samples, heating and evacuation are performed prior to the sputtering. Two types of samples are prepared for each of the sputtering processes, one with the AlN layer of the thickness of 0.5 μm, the other with the AlN layer of the thickness of 1.0 μm.

With the AlN layer formed on the PI film by DCMS, the FWHM of the X-ray rocking curve is as wide as 27 to 28 degrees, regardless of the film thickness, and the crystal orientation is insufficient.

With the AlN layer formed on the PI film at the thickness of 0.5 μm by RF sputtering, the FWHM of the X-ray rocking curve is 24.4 degrees, and the crystal orientation is insufficient. By increasing the film thickness to 1.0 μm, the FWHM is improved to 23.2 degrees, but the crystal orientation is still unsatisfactory.

With the AlN layer formed on the PI film by HiPIMS, the FWHM of the X-ray rocking curve is 6.5 degrees at the film thickness of 0.5 μm, and 6.0 degrees at the film thickness of 1.0 μm. By employing HiPIMS, FWHM of 7.0 degrees or less can be achieved, regardless of the thickness of the AlN layer. Based on this observation, the nitride layer 13 is formed on the polymer substrate by HiPIMS according to the embodiments.

Figure 3:
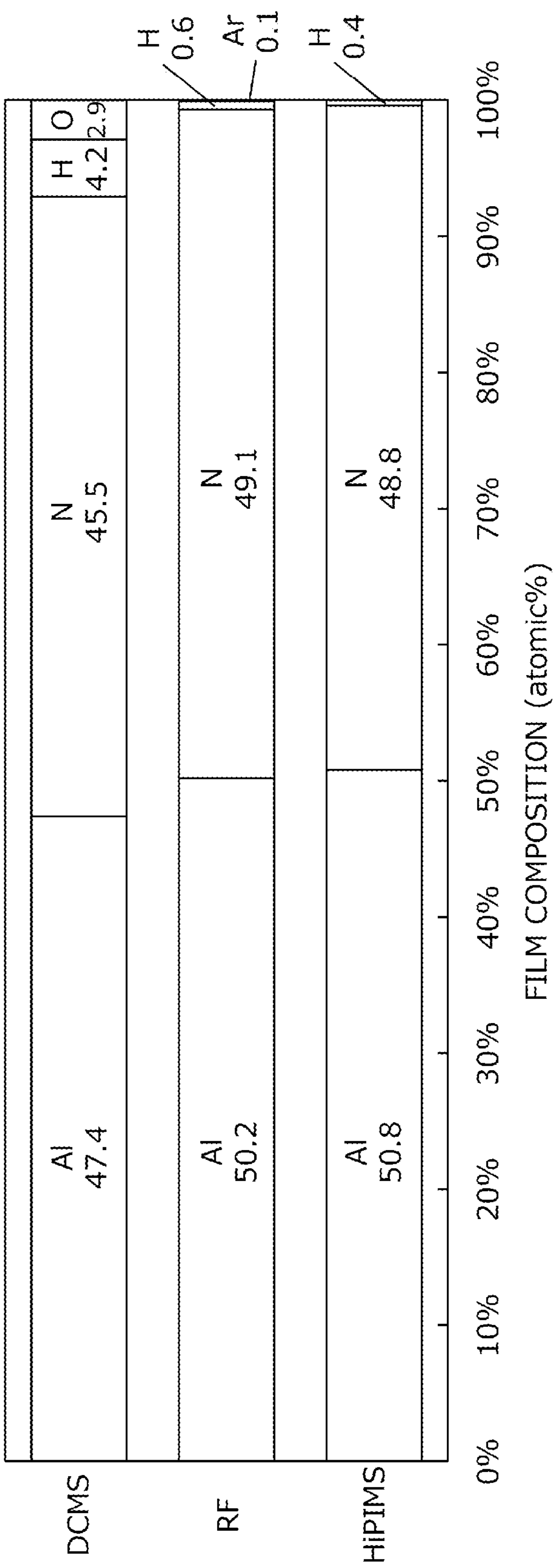
FIG. 3 shows the compositions of the nitride layers formed on the polymer substrates by the different processes.

FIG. 3 shows the compositions of the AlN layers formed by different sputtering processes. The contents of aluminum (Al), nitrogen (N), oxygen (O), and argon (Ar) in the film are measured by Rutherford backscattering analysis, and the hydrogen (H) content is measured by hydrogen forward scattering analysis.

By the DC sputtering method, 4.2 atm. % hydrogen (H) and 2.9 atm. % oxygen (O) are observed in the AlN layer, but the Ar content is too low to be detected.

By the RF sputtering method, the content of O atoms in the AlN layer is not observed, but 0.6 atm. % H and 0.1 atm. % Ar are detected. It may be considered that H ions and Ar ions of the inert gases are captured into the AlN layer during the sputtering process by a high-power application.

On the other hand, with the HiPIMS process, Ar and O are not observed in the AlN layer, and the H content is as low as 0.4 atm. %. It is understood that contamination in the AlN layer induced by water and/or captured Ar ions is suppressed in the HiPIMS process, and that a nitride layer having good crystal quality can be obtained.

FIG. 4 shows characteristics and film compositions of the nitride layer of examples and comparative examples. In Examples 1 to 4 and Comparative Example 1, an AlN layer is formed on a PI substrate by HiPIMS, and the film composition and the FWHM of the X-ray rocking curve are measured. In Example 5, a GaN layer as formed on the PI substrate by HiPIMS, and the rum composition and the FWHM of the X-ray rocking curve are measured. A degassing process is performed prior to the film deposition by HiPIMS for Examples 1 to 5, while no degassing is performed for Comparative Example 1.

In Comparative Example 2, an AlN layer is formed on the PI substrate by RF magnetron sputtering, and the film compositions and the FWHM of the X-ray rocking curve are measured. In Comparative Example 3, an AlN layer is formed on the PI substrate by DC magnetron sputtering, and the film compositions and the FWHM of the X-ray rocking curve are measured. In Comparative Example 4, a GaN layer is formed on the P1 substrate by DC magnetron sputtering, and the film compositions and the FWHM of the X-ray rocking curve are measured. No degassing process is performed for Comparative Examples 2 to 4.

Throughout Examples 1 to 5 and Comparative Examples 1 to 4, the thickness of the nitride layer (AlN layer or GaN layer) and the thickness of the metal layer used as the underlayer are measured by a focused ion beam transmission electron microscope (FIB-TEM) by observing the cross section of the FIB-TEM images. The X-ray rocking curve of each sample is measured using a powder X-ray diffractometer ("RINT-2000" manufactured by Rigaku Co., Ltd.) under the measurement conditions presented below. Then, the FWHM is calculated.

The measurement conditions are as follows.

Light Source: Cu-Kα ray (wavelength: 0.15418 nm)

Measurement Mode: θ scan

2θ Position: set a 2θ angle for each sample, at which the peak from the AlN (200) plane appears by X-ray diffraction Measurement Range: from 0 degrees to 20 setting angle Measurement interval: 0.1 degrees Divergence Slit: 1.00 mm Vertical Divergence Limiting Slit: 10 mm Exposure Time: 3 seconds.

EXAMPLE 1

A PI substrate with a thickness of 50 μm ("200EN" manufactured by Toray DuPont Co., Ltd.) was installed in a vacuum sputtering apparatus, and the chamber was sufficiently evacuated until a target vacuum degree of $3\times10^{-5}$ Pa was achieved to perform degassing. Then, Ar gas and $N_2$ gas were introduced at a flow rate ratio of Ar to $N_2$ of 83 to 17 ($Ar:N_2=83:17$) in the vacuum atmosphere (0.6 Pa or lower), and an AlN layer having a thickness of 0.5 μm was formed by HiPIMS, using an Al target. The average power of the HiPIMS process was 0.5 kW, the peak power was 52 kW, the frequency is 1000 Hz, and the pulse time was 20 microseconds. No underlying metal layer was provided under the AlN layer.

The FWHM of the X-ray rocking curve of Example 1 is as narrow as 6.5 degrees, showing good crystal orientation. The Al composition of the AlN layer is 50.8 atm. %, and the nitrogen composition is 48.8 atm. %, which is close to the stoichiometric composition. The H content is as low as 0.4 atm. %. The compositions of O and Ar are not observed. The value "0.01" in the parentheses of the Ar composition is the lower limit of the detection ability of the apparatus, and is indicated for the information.

EXAMPLE 2

A Mo layer was formed on the PI substrate, before the AlN layer was formed. The Mo layer of a thickness of 100 nm was formed using a Mo target by DC magnetron sputtering with a DC power of 0.4 kW in the Ar introduced vacuum atmosphere (0.2 Pa). Other than these parameters, the conditions were the same as those in Example 1. An AlN layer having a thickness of 0.5 μm was formed by HiPIMS on the Mo layer over the PI substrate.

The FWHM of the X-ray rocking curve of Example 2 is as narrow as 7.0 degrees, showing good crystal orientation.

The Al composition of the AlN layer is 49.5 atm. %, and the nitrogen composition is 50.2 atm. %, which is close to the stoichiometric composition. The H content is as low as 0.3 atm. %. The compositions of O and Ar are not observed.

EXAMPLE 3

A Ti layer was formed on the PI substrate, before the AlN layer was formed. The Ti layer of a thickness of 100 nm was formed using a Ti target by DC magnetron sputtering at a DC power of 0.4 kW in the Ar introduced vacuum atmosphere (0.2 Pa). Other than these parameters, the conditions were the same as those in Example 1. An AlN layer having a thickness of 0.5 μm was formed by HiPIMS on the Ti layer on the PI substrate.

The FWHM of the X-ray rocking curve of Example 3 is as narrow as 4.0 degrees, showing good crystal orientation. The Al composition of the AlN layer is 49.1 atm. %, and the nitrogen composition is 50.6 atm. %, which is close to the stoichiometric composition. The content of H is as low as 0.3 atm. %, similar to Example 2 in which the Mb layer is inserted. The compositions of O and Ar are not observed.

EXAMPLE 4

An Al layer was formed on the PI substrate under the same conditions as in Example 1, except that the film thickness of the AlN layer was 1 μm. The metal underlayer was not inserted under the AlN layer.

The FWHM of the X-ray rocking curve of Example 4 is 6.0 degrees. By increasing the thickness of the AlN layer so as to be thicker than in Example 1, the crystal orientation is improved, compared with Example 1. The Al composition of the AlN layer is 50.1 atm. %, and the nitrogen composition is 49.5 atm. %, which is close to the stoichiometric composition. The H content is 0.4 atm. %. The compositions of O and Ar are not observed, as in Example 1.

EXAMPLE 5

Only $N_2$ gas was introduced, without introducing Ar gas, with the flow rate ratio of Ar to $N_2$ of 0 to 100 (Ar:N2=0:100), and a GaN layer was formed by HiPIMS using a GaN target. The average power of the HiPIMS process was 0.2 kW, the peak power was 88 kW. The frequency was 200 Hz, and the pulse width was 30 microseconds. Except for these parameters, the GaN layer was formed on the PIE substrate under the same conditions as those in Example 1. No metal layer was inserted under the GaN layer.

The FWHM of the X-ray rocking curve of Example 5 is as narrow as 7.6 degrees, showing good crystal orientation. The composition of Ga in the GaN layer is 49.9 atm. %, and the nitrogen composition is 49.6 atm. %, which is close to the stoichiometric composition. The H content is 0.5 atm. %. The composition of O is not observed. The Ar composition is not observed because Ar gas is not used in this example.

Comparative Example 1

An AlN layer was formed on the PI substrate under the same conditions as in Example 1, except that the target vacuum degree of the degassing process before the film deposition of the AlN layer was set to $5\times10^{-4}$ Pa. The vacuum pressure of the degassing process is one power of ten (10) higher than that of Example 1.

The FWHM of the X-ray rocking curve of Comparative Example 1 is as wide as 29.0 degrees, and the crystal orientation of the AlN layer is unsatisfactory. The Al composition of the AlN layer is 48.5 atm. %, and the nitrogen composition is 49.3 atm. %, which deviates greatly from the stoichiometric composition, compared with Examples 1 to 4. The composition of H increases to 2.2 atm. %. It may be considered that the H composition increases because the vacuum degree of the degassing process is insufficient and because water remains in the chamber. Meanwhile, no compositions of O and Ar are observed, as in Examples 1 to 4.

Comparative Example 2

An AlN layer was formed on the PI substrate under the same conditions as in Example 1, except that an RF magnetron sputtering method (with an RF power 0.5 kW) was employed, using an RF power source as the sputtering power source.

The FWHM of the X-ray rocking curve of Comparative Example 2 is as wide as 24.4 degrees, and the crystal orientation of the AlN layer is unsatisfactory. The Al composition of the AlN layer is 50.2 atm. %, and the nitrogen composition is 49.1 atm. %, which is close to the stoichiometric composition. The H content increases to 0.6 atm. %. No composition of O is observed, while Ar of 0.1 atm. % is contained in the AlN layer.

Comparative Example 3

An AlN layer was formed on the P1 substrate under the same conditions as in Example 1, except that a DC magnetron sputtering method (with a DC power of 0.5 kW) was employed, using a DC power source as the sputtering power source.

The FWHM of the X-ray rocking curve of Comparative Example 3 is as wide as 27.8 degrees, and the crystal orientation of the AlN layer is unsatisfactory. The Al composition of the AlN layer is 47.4 atm. %, and the nitrogen composition is 45.5 atm. %, which deviates greatly from the stoichiometric composition, compared with Examples 1 to 4, The H content is as high as 4.2 atm. %. Furthermore, O and Ar are contained in the AlN layer.

From the results of Examples 1 to 4 and Comparative Examples 1 to 3, the FWHM of the X-ray rocking curve can be reduced to 8 degrees or less, preferably 7 degrees or less, regardless of the film thickness, by employing the HiPIMS process to form a nitride layer on the polymer substrate. These results support the characteristics shown in FIG. 2.

Comparative Example 4

A GaN layer was formed on the PI substrate under the same conditions as in Example 5, except that a DC magnetron sputtering method (with a DC power of 0.2 kW) was employed, using a DC power source as the sputtering power source.

The FWHM of the X-ray rocking curve of Comparative Example 4 is as wide as 29.8 degrees, and the crystal orientation of the GaN layer unsatisfactory. The Ga composition of the GaN layer is 47.7 atm. %, and the nitrogen composition is 47.6 atm. %, which is close to the stoichiometric composition. However, the H content is as high as 3.2 atm. %. In addition, O is contained in the GaN layer.

From the results of Examples 1 to 5 and Comparative Examples 1 to 4, the FWHM of the X-ray rocking curve can be reduced to 8 degrees or less, preferably 7 degrees or less, regardless of the film thickness, by employing the HiPIMS process to form a nitride layer on the polymer substrate. These results support the characteristics of FIG. 2.

From the results of Examples 1 to 5 and Comparative Examples 1 to 4, a nitride layer having a composition close to the stoichiometric composition can be formed, while suppressing contamination by contaminants such as H, O, or Ar atoms, by employing HiPIMS to form the nitride layer. These results support the compositions of FIG. 3.

With reference to FIG. 2 and FIG. 3, the Ar content in the AlN layer formed by HiPIMS is very small, and the FWHM of the X-ray rocking curve is also small. It may be speculated from this result that the crystal orientation is improved by reducing the amount of Ar in the film.

On the other hand, turning the attention to the film formation results of DC magnetron sputtering and RF magnetron sputtering, the FWHM of the X-ray rocking curve is smaller in RF magnetron sputtering than in DC sputtering, although the amount of Ar is slightly greater in the RF magnetron sputtering. From this, there could be the opposite speculation that the amount of Ar in the film does not always correlate with the crystal orientation.

The Ar content in the film formed by the DC magnetron sputtering is small, but the FWHM of the X-ray rocking curve is broad. This may be because the degree of vacuum in the film deposition chamber is insufficient, and because the crystal orientation misaligns due to the influence of the residual gas. It may be assumed that Ar, H, or O ions react with the nitride film, or that these ions are trapped in the wurtzite crystal to cause distortion of the crystal.

It may be difficult to derive the correlation between the Ar content in the film and the crystal orientation from FIG. 2 and FIG. 3, but it is concluded that reducing the contents of at least H and O by HiPIMS improves the crystal orientation.

It is understood from FIG. 3 and FIG. 4 that the atomic proportion of oxygen is 2.5 atm. % or less, and that the atomic proportion of hydrogen is 2.0 atm. % or less in the wurtzite nitride layer formed by HiPIMS on the polymer substrate. The FWHM of the X-ray rocking curve is 8 degrees or smaller.

A metal layer can be provided on at least one surface of the nitride layer. If the metal layer is inserted under the nitride layer in the stacking direction, the FWHM of the X-ray rocking curve is reduced, and the crystal orientation is improved.

The crystal orientation is also improved by degassing in the vacuum chamber before the film deposition of the nitride layer on the polymer substrate by the HiPIMS process.

The nitride laminate according to the embodiments can be applied to piezoelectric devices, high-frequency noise filters, concentration sensors, ultraviolet sensors, ultrasonic devices, light emitting devices, and so on.

The present application is based upon and claims priority to earlier filed Japanese Patent Application No. 2020-049416 filed Mar. 19, 2020 and to earlier filed Japanese Patent Application No. 2021-020426 filed Feb. 12, 2021. The entirety of both earlier-filed Japanese patent applications identified above are herein incorporated by reference.

LISTING OF SYMBOLS

10A to 10D: nitride laminate
11: polymer substrate
12: metal layer
13: nitride layer
14: metal layer

PRIOR ART DOCUMENT(S)

Patent Document(S)

Patent Document 1: JP H03-104308 A
Patent Document 2: JP 2008-211095 A
Patent Document 3: JP H07-316809 A

Non-Patent Document(s)

Non-Patent Document 1: K. A. Aissa et al., "AlN films deposited by dc magnetron sputtering and high power impulse magnetron sputtering for SAW application", Journal of Physics D applied Physics 48(14):145307, March 2015

What is claimed is:

1. A nitride laminate comprising:
a polymer substrate;
a nitride layer provided on at least one of surfaces of the polymer substrate; and
a metal layer between the polymer substrate and the nitride layer,
wherein the nitride layer is in direct contact with the metal layer,
wherein the nitride layer has a wurtzite crystal structure,
wherein an atomic proportion of oxygen in the nitride layer is 2.5 atm. % or less, and an atomic proportion of hydrogen in the nitride layer is 2.0 atm. % or less, and
wherein a full width at half maximum of an X-ray rocking curve of the nitride layer is 8 degrees or less.

2. The nitride laminate as claimed in claim 1,
wherein a material of the nitride layer is selected from aluminum nitride, gallium nitride, indium nitride, or a compound thereof.

3. The nitride laminate as claimed in claim 1,
wherein the nitride layer contains aluminum nitride as a main component.

4. The nitride laminate as claimed in claim 1,
wherein the polymer substrate is formed of a material selected from polyethylene terephthalate (PET), polyethylene naphthalate (PEN), polycarbonate (PC), acrylic resin, cycloolefin polymer, and polyimide (PI).

5. The nitride laminate as claimed in claim 1,
wherein a thickness of the nitride layer is from 10 nm to 10 μm.

6. The nitride laminate as claimed in claim 1,
wherein the metal layer is formed of a metal having a body-centered cubic structure, including molybdenum (Mo), tungsten (W), lithium (Li), tantalum (Ta), niobium (Nb), and a layered structure thereof, or a metal having a hexagonal close-packed structure, including titanium (Ti), hafnium (Hf), ruthenium (Ru), zirconium (Zr), cobalt (Co), and a layered structure thereof.

7. A manufacturing method of a nitride laminate, comprising:
forming a metal layer over a polymer substrate;
forming a nitride layer over the metal layer and in direct contact with the metal layer by a high power impulse magnetron sputtering at a substrate temperature of 150° C. or lower,
wherein the nitride layer has a wurtzite crystal structure,
wherein an atomic proportion of oxygen in the nitride layer is 2.5 atm. % or less, and an atomic proportion of hydrogen in the nitride layer is 2.0 atm. % or less, and wherein a full width at half maximum of an X-ray rocking curve of the nitride layer is 8 degrees or less.

8. The manufacturing method as claimed in claim 7, wherein degassing of a chamber is performed prior to film deposition of the nitride layer.

* * * * *